(12) United States Patent
Chan et al.

(10) Patent No.: US 6,979,367 B2
(45) Date of Patent: Dec. 27, 2005

(54) METHOD OF IMPROVING SURFACE PLANARITY

(75) Inventors: Chien-Ching Chan, Hsinchu (TW); Yun-Liang Ouyang, Taipei (TW); Yung-Wei Lu, Miaoli (TW)

(73) Assignee: United Microelectronics Corp., Hsinchu (TW)

( * ) Notice: Subject to any disclaimer, the term of this patent is extended or adjusted under 35 U.S.C. 154(b) by 170 days.

(21) Appl. No.: 10/637,598

(22) Filed: Aug. 11, 2003

(65) Prior Publication Data

US 2005/0037616 A1   Feb. 17, 2005

(51) Int. Cl.$^7$ .......................... C30B 25/12; C30B 25/14

(52) U.S. Cl. .......................... 117/88; 118/715; 118/719

(58) Field of Search .......................... 117/88; 118/715, 118/719

(56) References Cited

U.S. PATENT DOCUMENTS

| 5,976,261 A | * | 11/1999 | Moslehi et al. | ............. 118/719 |
| 6,464,790 B1 | * | 10/2002 | Sherstinsky et al. | ........ 118/715 |
| 6,557,607 B2 | * | 5/2003 | Yamada et al. | ............. 156/389 |

* cited by examiner

Primary Examiner—Felisa Hiteshew
(74) Attorney, Agent, or Firm—Jianq Chyun IP Office (57) ABSTRACT

A method of improving surface planarity of a wafer. The method includes forming a first thin-film layer on the wafer using CVD in a first thin film deposition apparatus having at least one gas injector, relative to which the wafer has a first orientation, and forming a second thin-film layer on the wafer using CVD. The second deposition takes place in a second thin film deposition apparatus having at least one second gas injector arranged the same as that in the first thin film deposition apparatus, the wafer having a second orientation relative to the gas injector in the second thin film deposition apparatus. A first angle between the two orientations results in the second apparatus' injector distributing material in a different area from that of the first gas injector.

17 Claims, 8 Drawing Sheets

METHOD OF IMPROVING SURFACE PLANARITY

BACKGROUND OF THE INVENTION

1. Field of the Invention

The present invention relates to a method of fabricating a semiconductor device, and more specifically to a method of improving surface planarity of a wafer when depositing a plurality of thin-film layers using chemical vapor deposition (CVD).

2. Description of the Related Art

Figure 1:
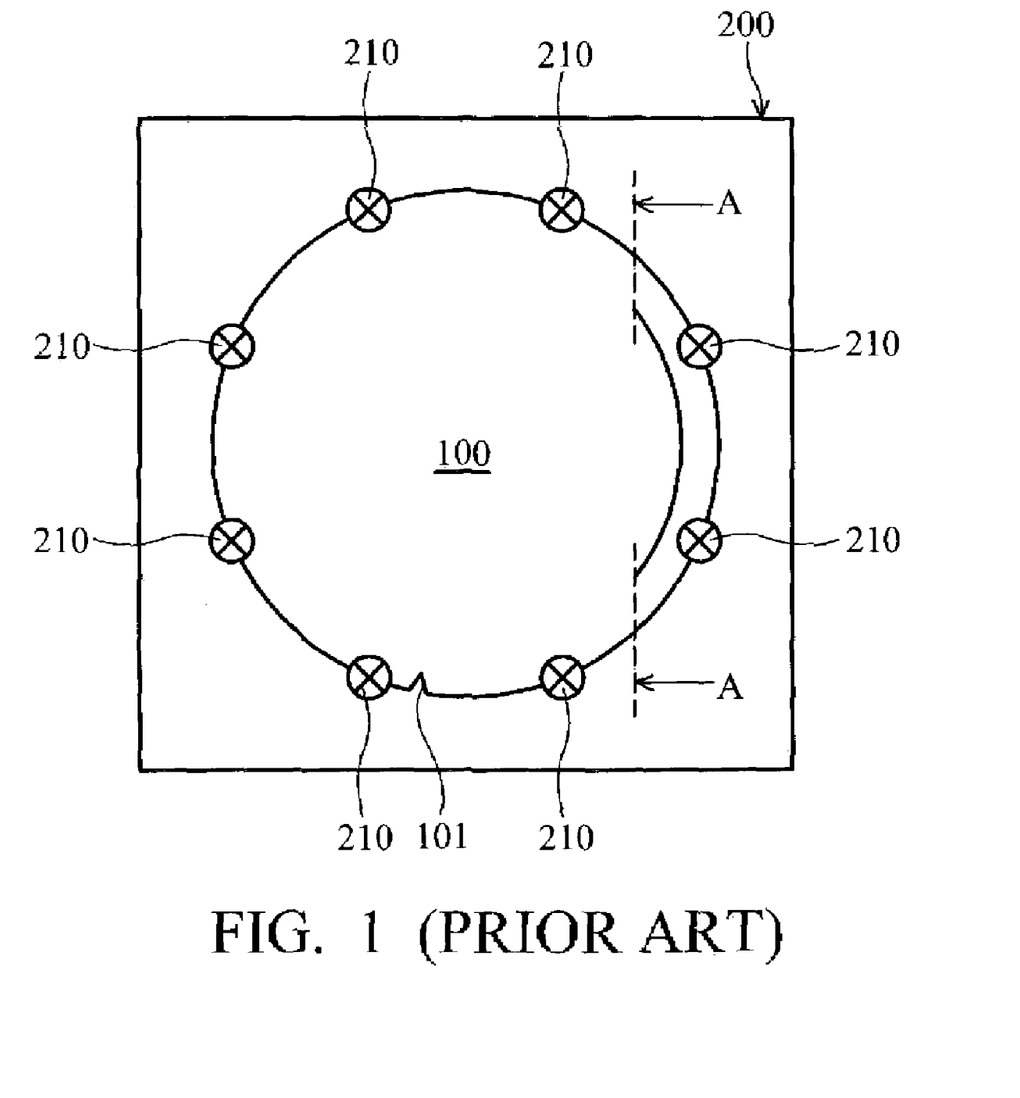
FIG. 1 is a simplified top view of a wafer in a chamber of a CVD thin film deposition apparatus.

FIG. 1 is a simplified top view of a wafer 100 in a chamber 200 of a CVD thin film deposition apparatus (not shown). The chamber 200 has eight gas injectors 210 uniformly arranged in a circle above the wafer 100. When starting CVD, a reactive gas enters the chamber 200 from gas injectors 210 and starts a chemical reaction to deposit a thin-film layer such as dielectric on the wafer 100.

Figure 2A:
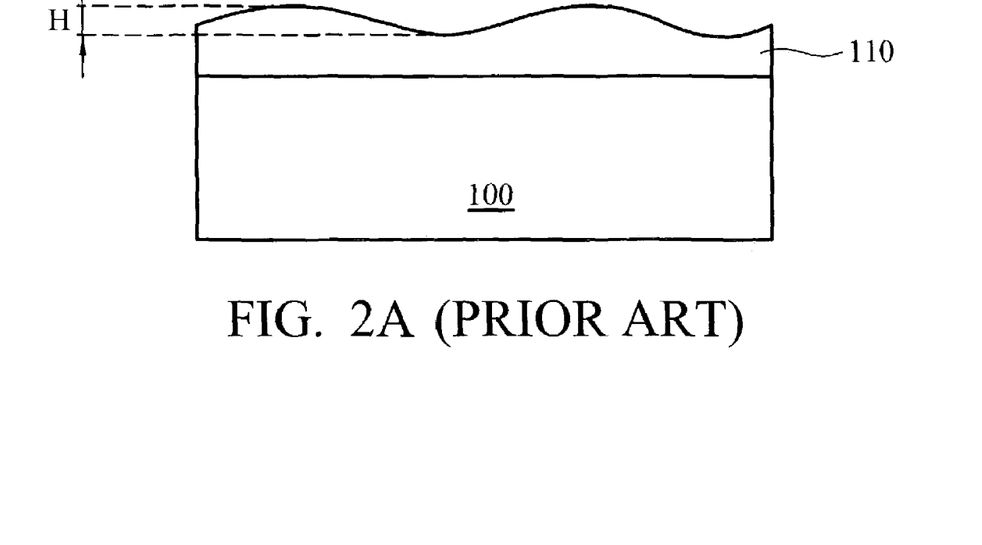
FIGS. 2A and 2B are cross-sections illustrating the height difference in wafer surface increasing as thin-film layers are deposited thereon during conventional thin-film layer deposition.

FIG. 2A is a cross-section of the profile of wafer 100 along arc AA in FIG. 1 after thin film deposition and planarization. A thin-film layer 110, such as a dielectric layer, is formed by CVD on the wafer 100. The concentration of the reactive gas is higher near the gas injectors 210, such that the proximity of the gas injectors 210 thickens the thin-film layer 110, resulting in an uneven surface. Even though the wafer 100 has undergone planarization, the surface of thin-film layer 110 is less than completely planarized. H in FIG. 2A indicates the height difference between the highest and lowest points of the surface of thin-film layer 110.

In FIG. 1, wafer 100 has an alignment notch 101 normally pointing in the same direction relative to the gas injectors 210, resulting in the same point on the wafer 100 remaining in the same position relative to the gas injectors 210 during deposition of the thin-film layers. Thus, the point recieves thicker deposition, such that, as more thin-film layers are deposited, the height difference on the surface of wafer 100 also increases. Using metallization of semiconductor fabrication process as an example, the height difference between the highest and lowest points of the wafer surface can reach approximately 2,000 Å.

Figure 2B:
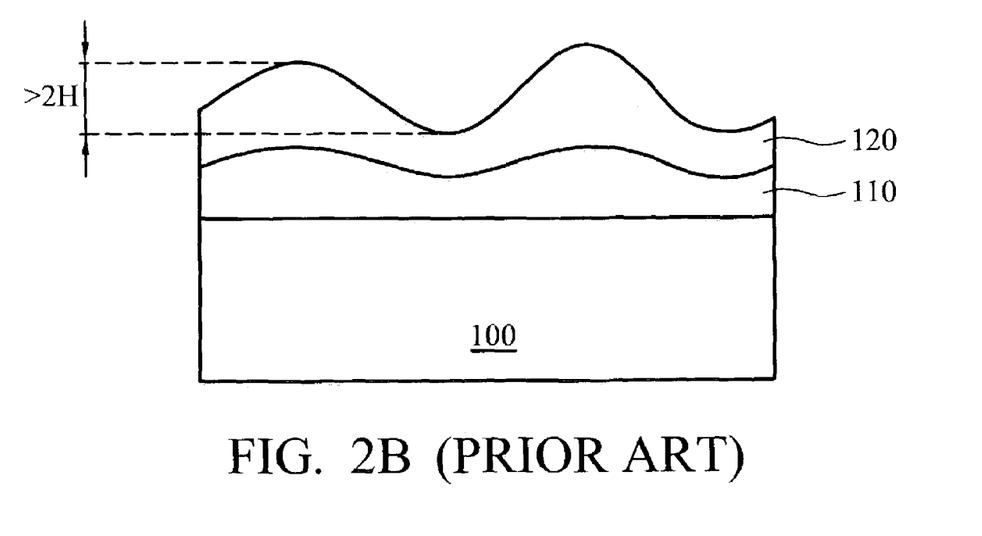

In FIG. 2B a thin-film layer 120 is deposited over the thin-film layer 110, by another thin film deposition apparatus having chamber 200. During deposition of thin-film layer 120 and 110, the notch 101 points in the same direction relative to gas injectors 210 of the two different thin film deposition apparatuses, such that the points having previously received thicker thin-film layer 110 now receive another thick thin-film layer 120, and those having previously received thinner thin-film layer 110 now receive only another thin-film layer 120. Further, the thicker thin-film layer 110 tends to gather more reactant particles than the thinner thin-film layer 110 during deposition of thin-film layer 120, such that, when deposition recipes are the same during deposition of thin-film layers 120 and 110, the height difference between the highest and lowest points of the thin-film layer 120 will be larger than 2H even though planarization is performed on the thin-film layer 120. The uneven surface of thin-film layer 120 may not be successfully focused during pattern definition on the thin-film layer 120, deteriorating the critical dimension (CD) control of the patterns, and thereby negatively affecting yield and reliability.

SUMMARY OF THE INVENTION

Thus, the main object of the present invention is to provide a method of improving surface planarity of a wafer when depositing a plurality of thin-film layers on the wafer using CVD, thereby providing excellent improvement of the surface planarity of the wafer, improving the pattern CD control when defining patterns on every thin-film layer, and enhancing process yield and product reliability.

In order to achieve the above objects, the present invention provides a method of improving surface planarity of a wafer during deposition of thin-film layers thereon using CVD. First, a first thin-film layer is formed overlying the wafer, using CVD in a first thin film deposition apparatus having at least one gas injector. The wafer has a first orientation relative to the first gas injector. Then, a second thin-film layer is formed overlying the wafer using CVD in a second thin film deposition apparatus having at least one gas injector arranged in the same way as that in the first apparatus. The wafer has a second orientation relative to the gas injector in the second apparatus. A first angle is provided between the two orientations, resulting in the second apparatus' injector distributing material in a different area from that of the first gas injector.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

The following embodiment is intended to illustrate the invention more fully without limiting its scope, since numerous modifications and variations will be apparent to those skilled in this art.

Figure 3A:
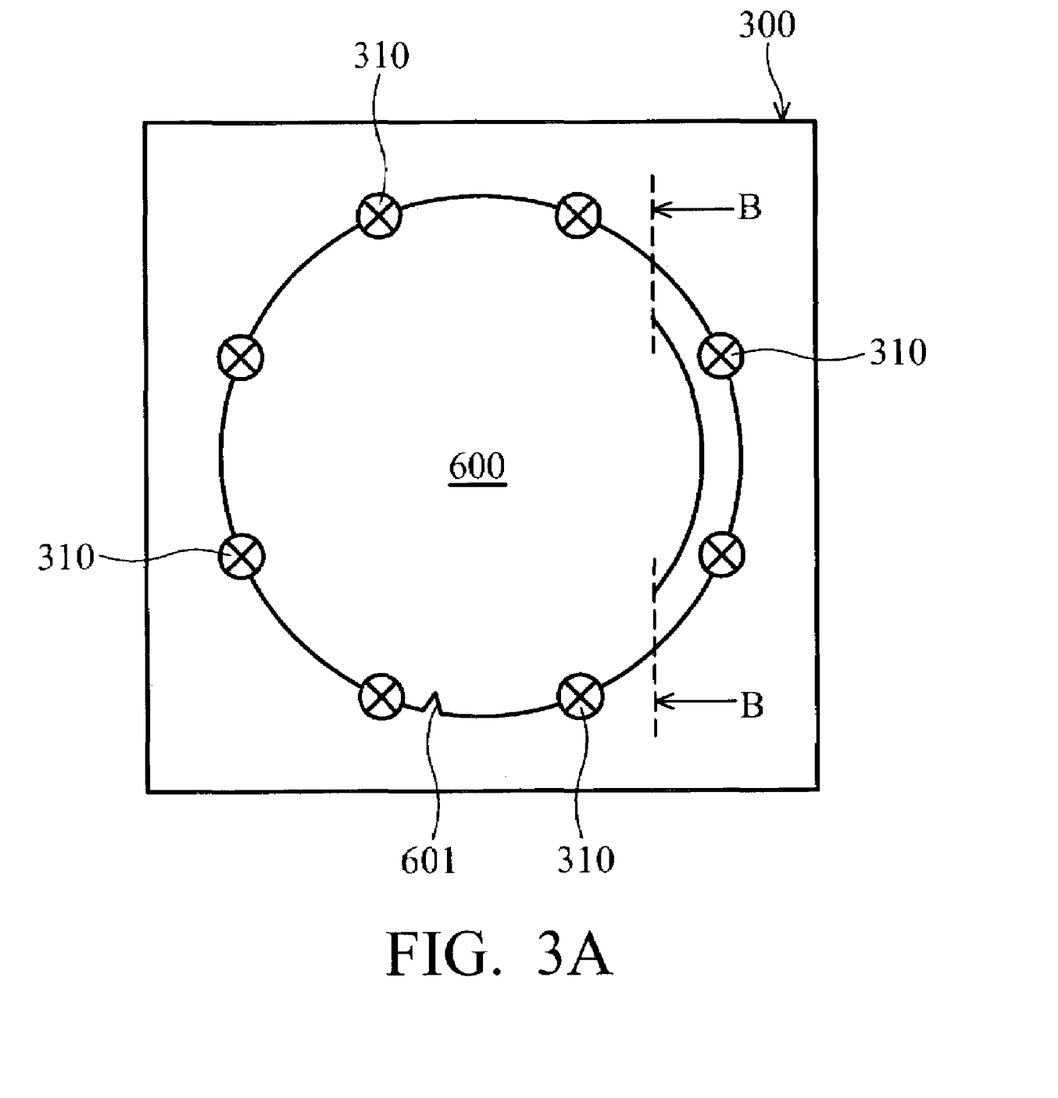
FIGS. 3A through 3D are simplified top views illustrating a method of improving surface planarity of a wafer according to the present invention.

FIG. 3A is a simplified top view of a wafer 600 in a chamber 300 of a first CVD thin film deposition apparatus (not shown). The chamber 300 has eight gas injectors 310 uniformly arranged in a circle above the wafer 600. When starting CVD, a reactive gas enters the chamber 300 from gas injectors 310 and starts a chemical reaction to deposit a thin-film layer such as dielectric on the wafer 600. The wafer 600 has an alignment element such as a notch 601 to enable orientation thereof.

Figure 4A:
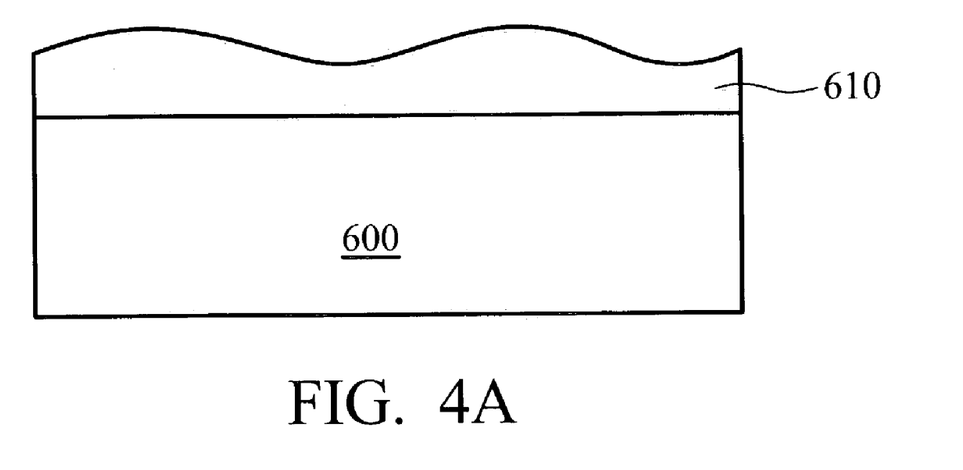
FIGS. 4A through 4D are cross-sections illustrating the manufacturing steps and results according to the present invention.

FIG. 4A is a cross-section of the profile of wafer 600 along arc BB in FIG. 3A after thin film deposition and planarization in which thin-film layer 610, such as a dielectric layer, is formed by CVD. The concentration of the reactive gas is higher near the gas injectors 310, such that proximity the gas injectors 310 thickens the thin-film layer 610, resulting in an uneven surface. Even though the wafer 600 has undergone planarization, the surface of thin-film layer 610 is less than completely planarized.

Figure 3B:
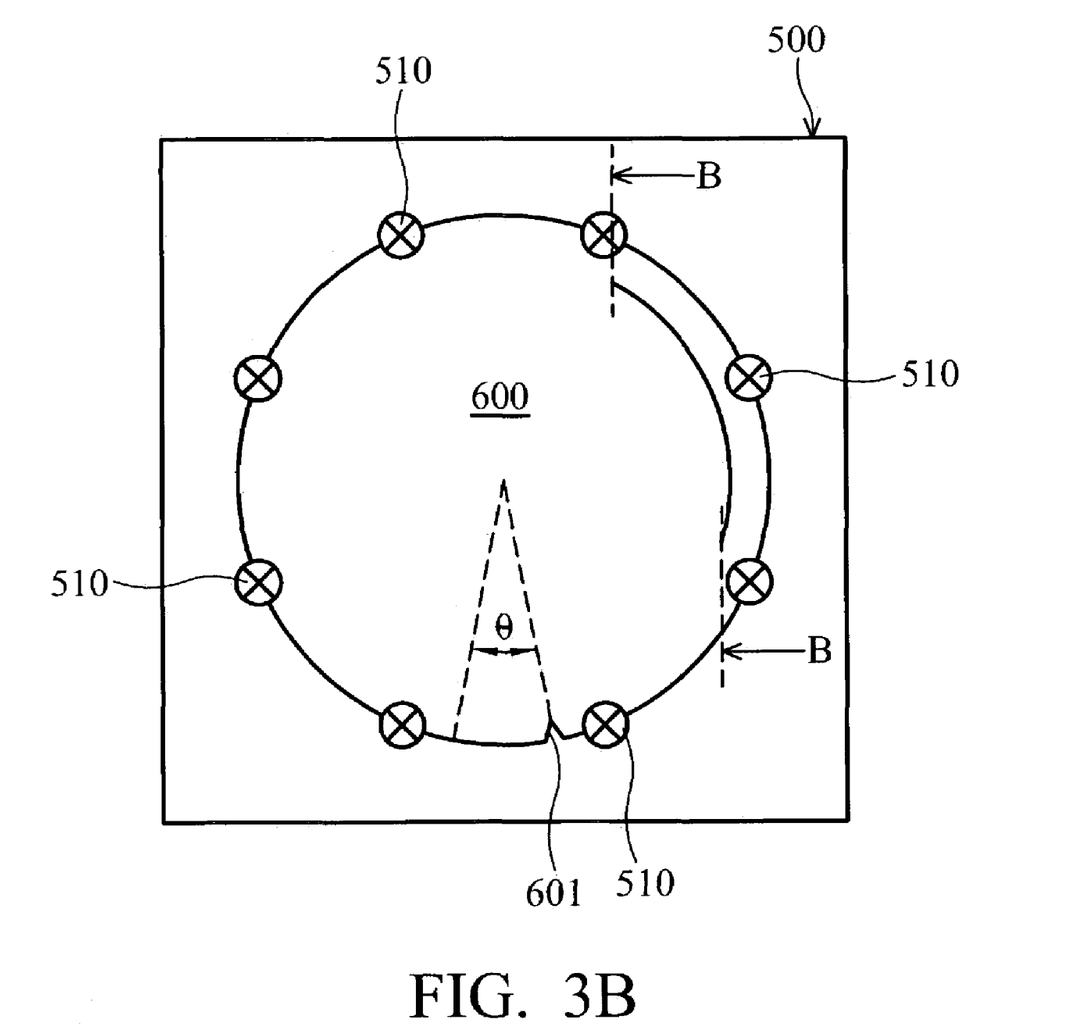

FIG. 3B is a simplified top view of the wafer 600 in a chamber 500 of a second CVD thin film deposition apparatus (not shown). The quantity and arrangement of gas injectors 510 in the chamber 500 are effectively the same as those of gas injectors 310. Thus, it is necessary to change the orientation of wafer in the second CVD thin film deposition apparatus, that is, the orientation of wafer 600 relative to every gas injector 310 must be different from that relative to gas injectors 510. It is preferred that the points, when closer to one of gas injectors 310 and receiving thicker thin-film layer 610 therefrom, will be farther from corresponding gas injectors 510, thereby receiving thinner thin-film layer 620 therefrom, and vice versa. Thus, thickness distributions of every thin-film layer deposited on wafer 600 are made complementary to each other, thereby improving the planarity of wafer 600.

Compared to FIG. 3A, wafer 600 in FIG. 3B is rotated, resulting in an angle θ provided between the orientations of wafer 600 relative to gas injectors 310 and 510, identifiable according to the positions of notch 601 in FIGS. 3A and 3B. The value of angle θ preferably depends on the quantity and arrangement of gas injectors of every thin film deposition apparatus. The value of angle θ further depends on the number of thin-film layers to be deposited. The value of angle θ is preferably approximately (360°/2×N) or odd multiples thereof, wherein "N" is the number of gas injectors 310, resulting in the points receiving the thickest thin-film layer 610 receive the thinnest thin-film layer 620, and vice versa. Thus, thickness distributions of the neighboring thin-films 610 and 620 are made complementary to each other, thereby eliminating surface unevenness. That is, height difference of the highest and lowest points is less than the depth of field when patterning every thin-film layer deposited on wafer 600. The depth of field depends on the light source (wavelength), resist, CD, and other factors affecting the patterning quality when patterning every thin-film layer. Thus, CD of patterns on every thin-film layer is well controlled. The value of angle θ can further be approximately A×(360°/M×N), wherein "N" is the number of gas injectors 310, "M" is one of the factors of the number of thin-film layers deposited on wafer 600 other than 1, and "A" is an integer other than 0, M, or multiples of M. For example, when six thin-film layers are to be deposited on wafer 600, factors of six are 1, 2, 3, and 6. Therefore, the value of M is 2, 3, or 6. When the value of M is 3, thickness distributions of three continuous thin-film layers are made complementary to each other. However, the value of A cannot be 0, 3, or multiples of 3 when, the value of M is 3. When the value of A is 0, the value of angle θ will be 0, as in the prior art. When the value of A is 3 or multiples of 3, the points, closest to any of gas injectors 310 and receiving the thickest thin-film layer 610, will be rotated to the orientations closest to any of gas injectors 510 and receiving the thickest thin-film layer 620, as in the prior art.

Figure 4B:
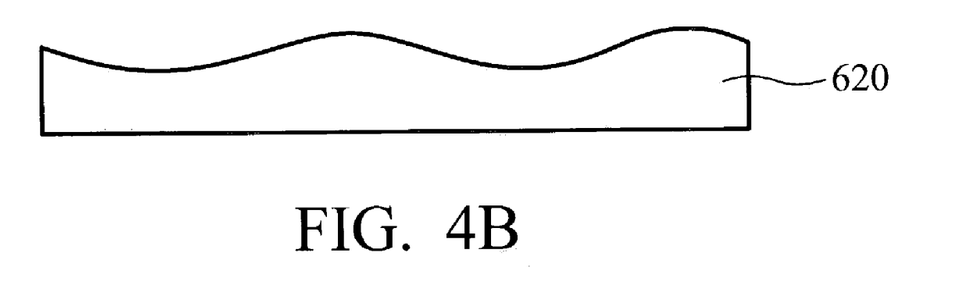
Figure 4C:
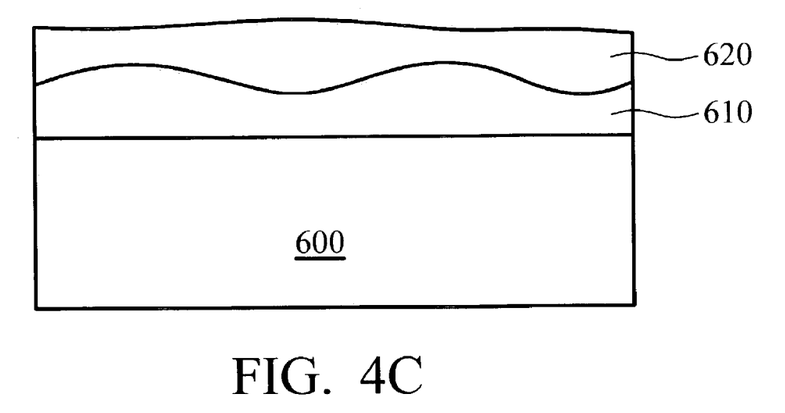

In this embodiment, the value of angle θ is approximately (360°/2×N), with eight gas injectors 310, such that the value of angle E is approximately 22.5°. The thickness distributions of thin-film layer 620 on wafer 600 are shown in FIG. 4B, a cross-section along the arc BB in FIG. 3B. Compared to wafer 100 in FIG. 2B, planarity of wafer 600 improves when thin-film layer 620 is deposited on wafer 600.

Figure 3C:
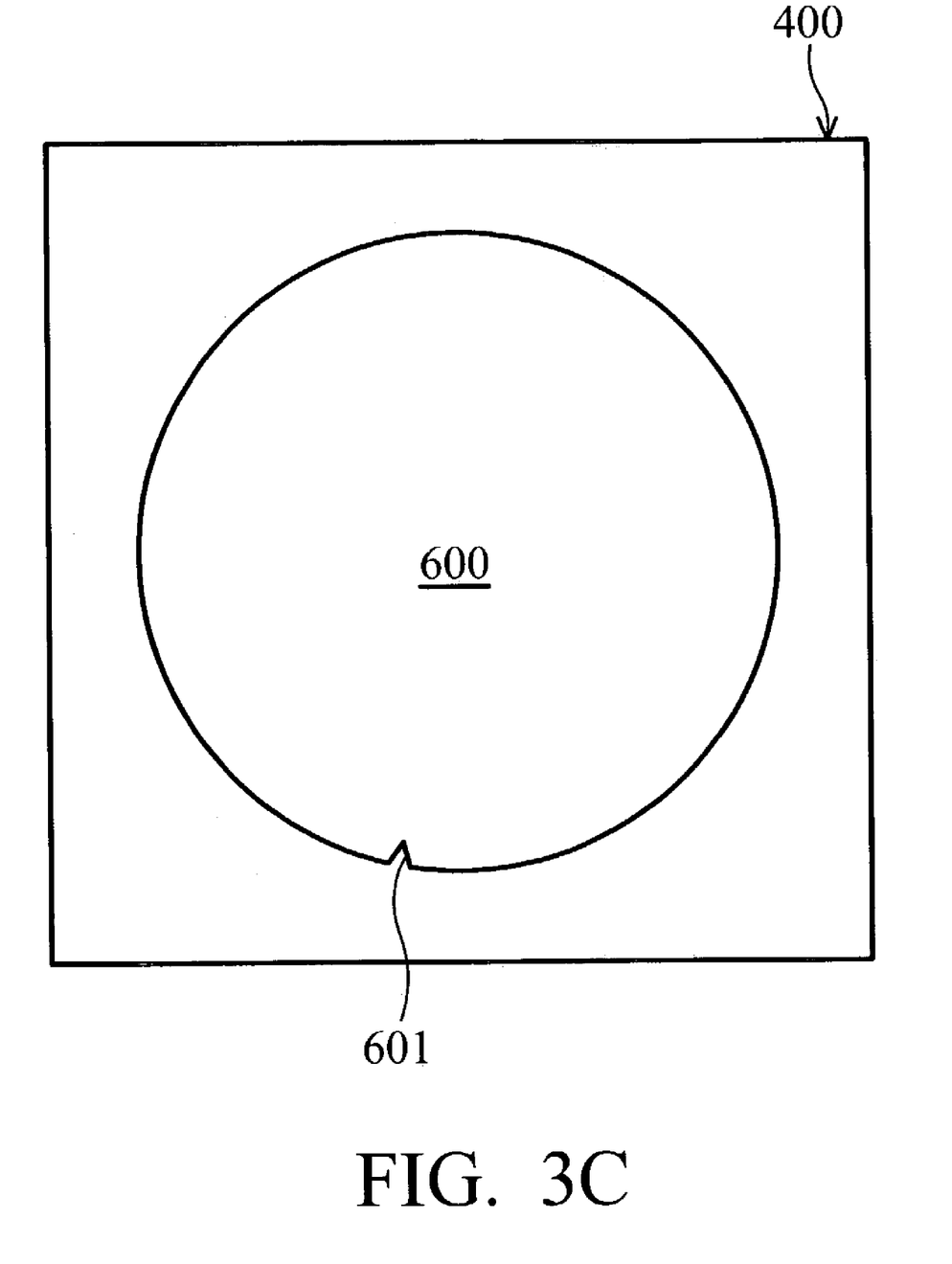
Figure 3D:
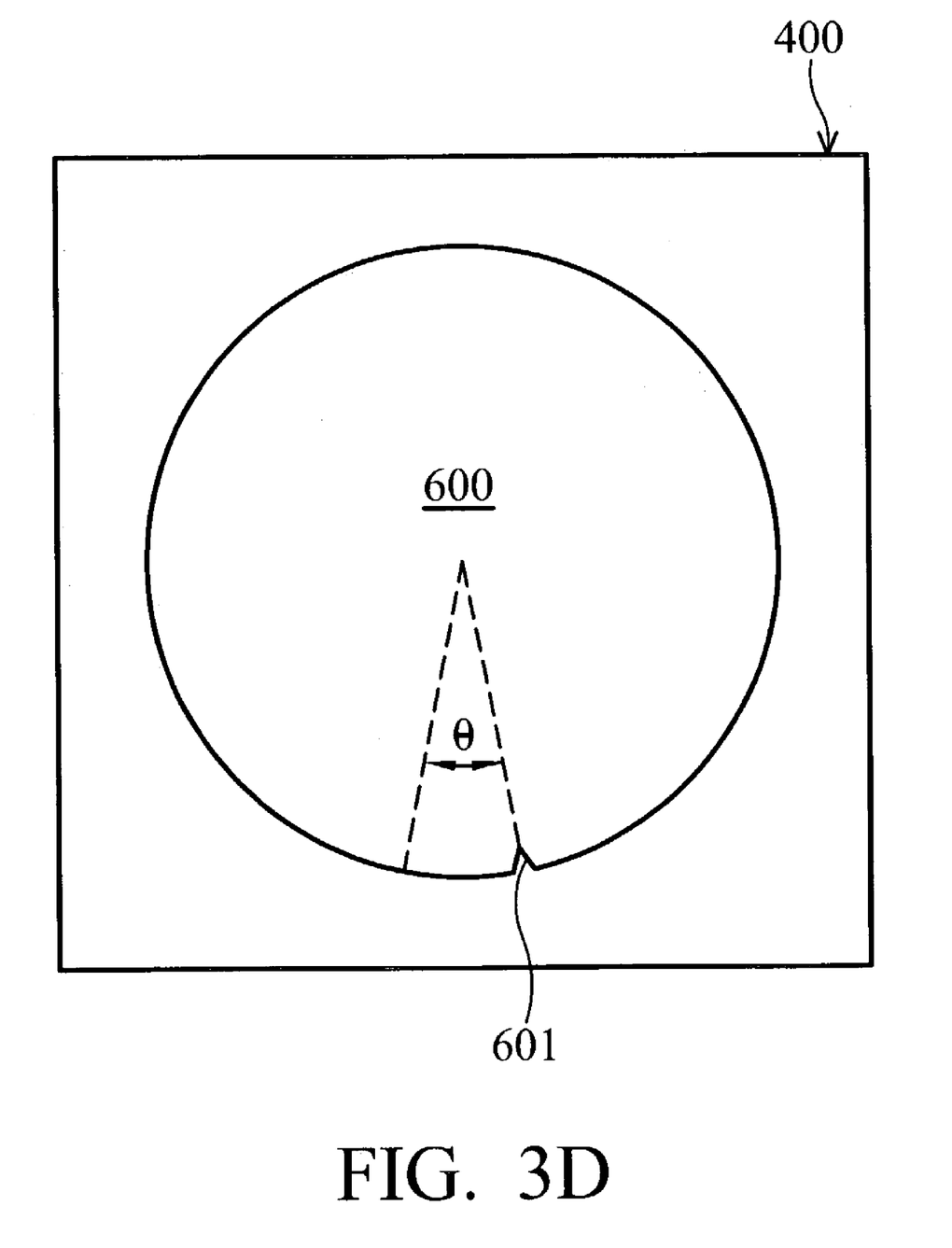

Referring to FIG. 3C, when a thin-film deposition apparatus does not provide control of the orientation of the wafer, a direction-control apparatus 400 is provided. For example, wafer 600 is loaded into the direction-control apparatus 400 and rotated by angle θ, approximately 22.5° in this embodiment, as shown in FIG. 3D.

Figure 4D:
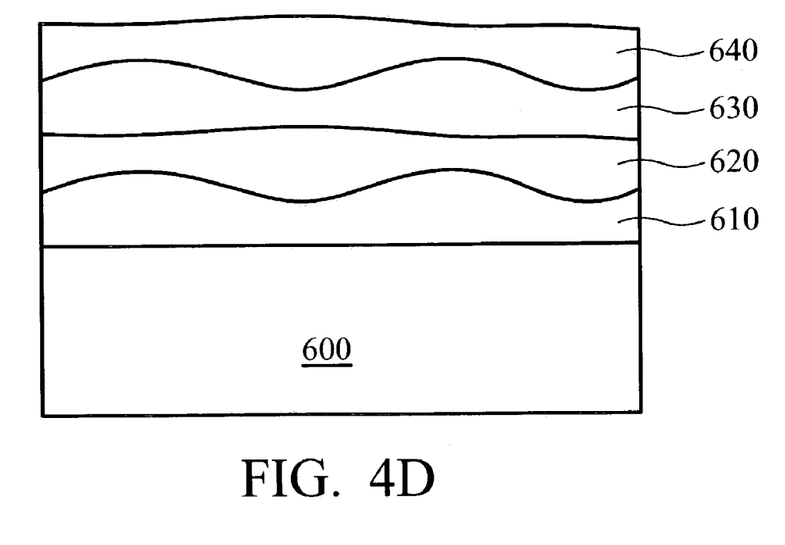

Referring to FIG. 4D, repeating the method of depositing the thin-film layer on wafer 600, thin-film layers 630 and 640, such as dielectric layers, are respectively deposited, using a third and fourth CVD thin film deposition apparatus (neither shown) respectively having the same quantity and arrangement of gas injectors as those of the second thin film deposition apparatus. Planarity does not suffer with the increase in the number of thin-film layers deposited, thereby achieving the main object of the present invention.

Further, quantity and arrangement of gas injectors of the thin-film deposition apparatus depend on series numbers and manufacturers thereof. The first through fourth CVD thin-film deposition apparatuses, having eight gas injectors arranged in a circle, in this embodiment, correspond to only one available model. CVD thin-film deposition apparatus may provide twelve gas injectors arranged in a circle, or numerous other configurations. Note that the first through fourth CVD thin-film deposition apparatuses in this embodiment are-used as an example, and are not intended to limit the scope of the present invention. Those skilled in the art will recognize the possibility for use of any CVD thin-film deposition apparatus and of modification according thereto.

Although the present invention has been particularly shown and described above with reference to two specific embodiments, it is anticipated that alterations and modifications thereof will no doubt become apparent to those skilled in the art. It is therefore intended that the following claims be interpreted as covering all such alteration and modifications as fall within the true spirit and scope of the present invention.

What is claimed is:

1. A method of improving surface planarity of a wafer during deposition of thin-film layers thereon using chemical vapor deposition (CVD), comprising:
    forming a first thin-film layer overlying the wafer using CVD in a first thin film deposition apparatus having at least one gas injector, the wafer having a first orientation relative to the first gas injector; and
    forming a second thin-film layer overlying the wafer using CVD in a second thin film deposition apparatus having at least one gas injector arranged in the same way as that in the first thin film deposition apparatus, the wafer having a second orientation relative to the gas injector in the second apparatus, thereby providing a first angle between the two orientations, resulting in the second apparatus' injector distributing material in a different area from that of the first gas injector.

2. The method as claimed in claim 1, wherein the first thin film deposition apparatus comprises a plurality of gas injectors uniformly arranged in a circle.

3. The method as claimed in claim 2, wherein the first angle is approximately A×(360°/M×N), wherein "N" is the number of gas injectors in the first thin film deposition apparatus, "M" is one of the factors of the number of thin-film layers other than 1, and "A" is an integer other than 0, M, or multiples of M.

4. The method as claimed in claim 2, wherein the first angle is approximately one of the odd multiples of (360°/2×N), wherein "N" is the number of gas injectors in the first thin film deposition apparatus.

5. The method as claimed in claim 2, wherein the number of gas injectors in the first thin film deposition apparatus is 8 or 12.

6. The structure as claimed in claim 1, wherein the loading paths of the wafer into the first thin film deposition apparatus and second thin film deposition apparatus are effectively the same, and steps taken before loading the wafer into the second thin film deposition apparatus further comprise:

providing a wafer orientation control apparatus; and rotating the wafer by a second angle effectively the same as the first angle, using the wafer orientation control apparatus;

wherein the wafer has the first orientation during deposition of the first thin-film layer using the wafer orientation control apparatus.

7. The method as claimed in claim 1, wherein the thin-film layers are dielectric layers.

8. The method as claimed in claim 1, wherein the wafer comprises an alignment design.

9. The method as claimed in claim 8, wherein the alignment design is a notch.

10. A method of improving surface planarity of a wafer during deposition of thin-film layers thereon using chemical vapor deposition (CVD), comprising:

forming a first thin-film layer overlying the wafer using CVD in a first thin film deposition apparatus having a plurality of gas injectors uniformly arranged in a circle, the wafer having a first orientation relative to the first gas injectors; and forming a second thin-film layer overlying the wafer using CVD, in a second thin film deposition apparatus having a plurality of gas injectors with quantity and arrangement the same as those, of the first thin film deposition apparatus, the wafer having a second orientation relative to the gas injector in the second apparatus, thereby providing a first angle between the two orientations, resulting in gas injectors in the second thin film deposition apparatus having angles of incidence on the wafer different from those of the first thin film deposition apparatus.

11. The method as claimed in claim 10, wherein the first angle is approximately $A \times (360°/M \times N)$, wherein "N" is the number of gas injectors in the first thin film deposition apparatus, "M" is one of the factors of the number of thin-film layers to be deposited other than 1, and "A" is an integer other than 0, M, or a multiple of M.

12. The method as claimed in claim 10, wherein the first angle is an odd multiple of $(360°/2 \times N)$, wherein "N" is the number of gas injectors in the first thin film deposition apparatus.

13. The method as claimed in claim 10, wherein the number of gas injectors in the first thin film deposition apparatus is 8 or 12.

14. The structure as claimed in claim 10, wherein the loading paths of the wafer into the first thin film deposition apparatus and second thin film deposition apparatus are effectively the same, and steps taken before loading the wafer into the second thin film deposition apparatus further comprise:

providing a wafer orientation control apparatus; and rotating the wafer by a second angle effectively the same as the first angle using the wafer orientation control apparatus;

wherein the wafer has the first orientation between depositing the first thin-film layer and using the wafer orientation control apparatus.

15. The method as claimed in claim 10, wherein the thin-film layers are dielectric layers.

16. The method as claimed in claim 10, wherein the wafer comprises an alignment design.

17. The method as claimed in claim 16, wherein the alignment design is a notch.

* * * * *